United States Patent
Yaegashi

(10) Patent No.: US 10,741,444 B2
(45) Date of Patent: Aug. 11, 2020

(54) METHOD OF FORMING FILM

(71) Applicant: Tokyo Electron Limited, Tokyo (JP)

(72) Inventor: Hidetami Yaegashi, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/406,059

(22) Filed: May 8, 2019

(65) Prior Publication Data

US 2019/0355613 A1 Nov. 21, 2019

(30) Foreign Application Priority Data

May 15, 2018 (JP) .................. 2018-093541

(51) Int. Cl.
| | |
|---|---|
| *H01L 21/768* | (2006.01) |
| *H01L 21/027* | (2006.01) |
| *H01L 21/285* | (2006.01) |
| *G03F 7/20* | (2006.01) |
| *G03F 7/16* | (2006.01) |

(52) U.S. Cl.
CPC ...... *H01L 21/7688* (2013.01); *H01L 21/0272* (2013.01); *H01L 21/2855* (2013.01); *G03F 7/16* (2013.01); *G03F 7/20* (2013.01)

(58) Field of Classification Search
CPC . H01L 21/302; H01L 21/308; H01L 21/3086; H01L 2224/0347
See application file for complete search history.

(56) References Cited

U.S. PATENT DOCUMENTS

| | | | |
|---|---|---|---|
| 2002/0127495 A1* | 9/2002 | Scherer ............... | B81C 1/00404 430/314 |
| 2013/0224931 A1* | 8/2013 | Sorada .................. | H01L 27/101 438/382 |

FOREIGN PATENT DOCUMENTS

| | | | | |
|---|---|---|---|---|
| JP | 58143527 A | * | 8/1983 | ........... H01L 21/302 |
| JP | 2007-200966 A | | 8/2007 | |

* cited by examiner

*Primary Examiner* — Ermias T Woldegeorgis
(74) *Attorney, Agent, or Firm* — Studebaker & Brackett PC

(57) ABSTRACT

In a method according to an exemplary embodiment, a substrate is prepared in a chamber. A patterned resist mask has been formed on a first region of the substrate. A surface of the substrate in a second region is exposed. A film is formed on the substrate in the chamber by sputtering. The film is formed on the substrate in a manner that particles emitted obliquely downward from a target are caused to be incident onto the substrate.

3 Claims, 11 Drawing Sheets

METHOD OF FORMING FILM

CROSS-REFERENCE TO RELATED APPLICATIONS

This application is based on and claims the benefit of priority from Japanese Patent Application No. 2018-093541 filed on May 15, 2018, the entire contents of which are incorporated herein by reference.

TECHNICAL FIELD

An exemplary embodiment of the present disclosure relates to a method of forming a film.

BACKGROUND

A lift-off process is used in a technology of forming a patterned film. In this technology, a resist mask is formed on a partial region of a substrate. A film is formed on the substrate by sputtering. Then, the resist mask is lifted off. The film is removed from the region on which the resist mask has been formed. The film remains on a region on which the resist mask does not have been formed. Japanese Patent Application Laid-Open Publication No. 2007-200966 discloses such a technology.

SUMMARY

In an exemplary embodiment, there is provided a method of forming a film on a substrate. The method includes a step of preparing the substrate in a chamber and a step of forming the film on the substrate in the chamber by sputtering. The substrate has a first region and a second region. A patterned resist mask has been formed on the first region. A surface of the second region is exposed. The film is formed on the substrate by causing particles emitted obliquely downward from a target to be incident onto the substrate while a relation between a predetermined direction defined for a pattern of the resist mask and a normal direction of the surface of the target is maintained.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
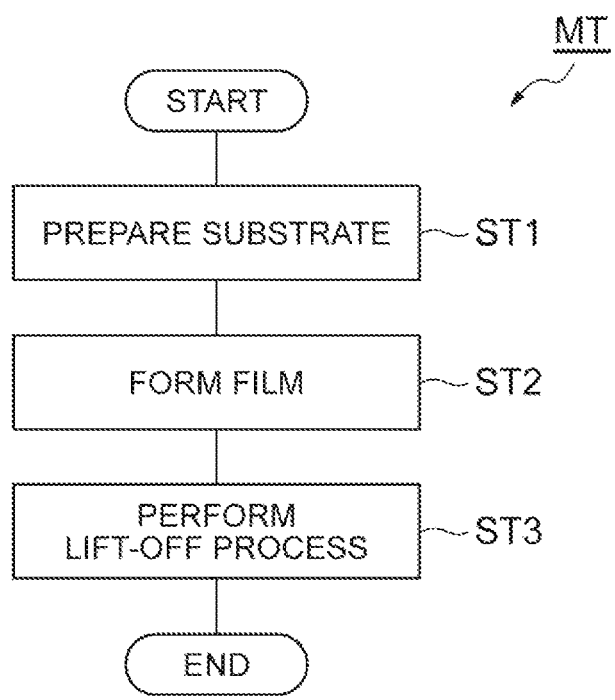
FIG. 1 is a flowchart illustrating a method of forming a film according to an exemplary embodiment.

Hereinafter, various exemplary embodiments will be described.

In order to allow efficient performing of lift-off, it is necessary to widen a region of a surface of a resist mask from which a remover solution (or chemical species) can penetrate into the resist mask. Thus, it is required to enable a film to be formed on a region on which the resist mask is not formed, and enable a region of the surface of the resist mask which is not covered by the film to be widened.

In an exemplary embodiment, there is provided a method of forming a film on a substrate. The method includes a step of preparing the substrate in a chamber and a step of forming the film on the substrate in the chamber by sputtering. The substrate has a first region and a second region. A patterned resist mask has been formed on the first region. A surface of the second region is exposed. The film is formed on the substrate by causing particles emitted obliquely downward from a target to be incident onto the substrate while a relation between a predetermined direction defined for a pattern of the resist mask and a normal direction of the surface of the target is maintained.

According to the embodiment, since particles from a target are obliquely incident onto the substrate, the film is not formed on a portion hidden in an incident direction of the particles. Thus, the film is formed on the second region, and the film is partially formed on the resist mask. Therefore, a region which is not covered by the film on the surface of the resist mask is widened.

In an exemplary embodiment, a pattern of the resist mask may be a line-and-space pattern.

In an exemplary embodiment, the predetermined direction may be a direction in which a plurality of lines and a plurality of spaces are alternately arranged in the line-and-space pattern.

In an exemplary embodiment, a relation between the height h of each of the plurality of lines, the width $CD_{SPC}$ of each of the plurality of spaces, and an angle $\theta$ formed by the normal direction and a horizontal plane may satisfy $CD_{SPC} \leq h/\tan\theta$. According to the embodiment, it is possible to suppress an occurrence of a situation in which the film is formed on the surface of the first region exposed in a space of the resist mask.

In an exemplary embodiment, the method may further include removing the resist mask by a lift-off process after the forming the film on the substrate is performed.

In an exemplary embodiment, the film may be a metal-containing film. The metal-containing film may be formed from titanium, tungsten, aluminum, an oxide or a nitride of titanium, an oxide or a nitride of tungsten, or an oxide or a nitride of aluminum.

Hereinafter, various embodiments will be described in detail with reference to the drawings. In the drawing, the same or equivalent portions are denoted by the same reference symbols.

Figure 2:
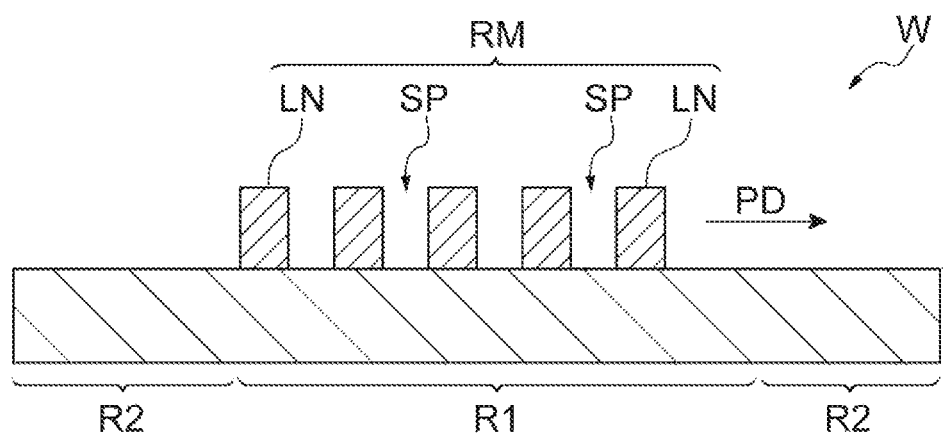
FIG. 2 is a partially-enlarged sectional view illustrating an example of a substrate.

FIG. 1 is a flowchart illustrating a method of forming a film, according to an exemplary embodiment. A method MT illustrated in FIG. 1 starts in Step ST1. In Step ST1, a substrate is prepared in a chamber of a film formation apparatus. FIG. 2 is a partially-enlarged sectional view illustrating an example of a substrate. A substrate W illustrated in FIG. 2 may have a disk shape, for example. The substrate W may have a rectangular planar shape.

The substrate W includes a first region R1 and a second region R2. The number of first regions R1 in the substrate W is arbitrary number. The number of second regions R2 in the substrate W is arbitrary number. The first region R1 and the second region R2 provides the surface of the substrate W. In the method MT, a film is formed on the second region R2, and a film formed on the first region R1 is easily removed by a lift-off process.

Figure 3:
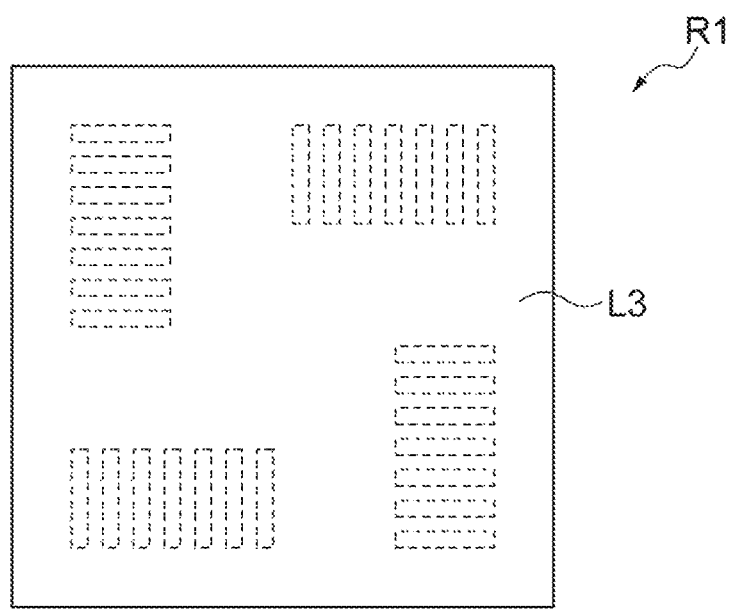
FIG. 3 is a plan view illustrating an example of a first region.
Figure 4:
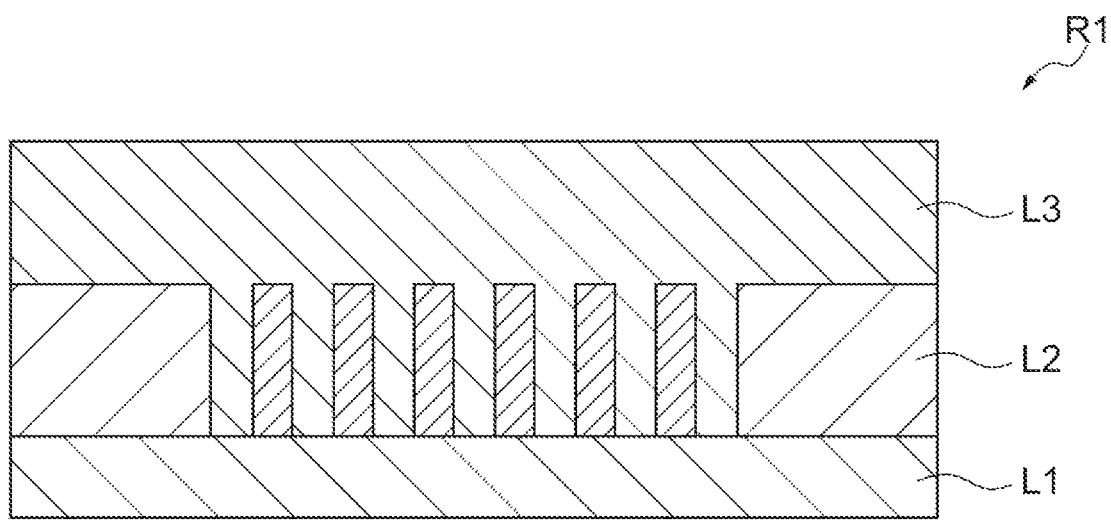
FIG. 4 is a partially-enlarged sectional view illustrating an example of the first region.

The first region R1 is a region having an overlay mark, for example, but is not limited to such a region. FIG. 3 is a plan view illustrating an example of a first region. FIG. 4 is a partially-enlarged sectional view illustrating an example of the first region. In an example, the first region R1 includes a first layer L1, a second layer L2, and a third layer L3. The first layer L1, the second layer L2, and the third layer L3 may constitute the second region R2. The number of layers constituting the first region R1 and the number of layers constituting the second region R2 are not limited.

The first layer L1 is an underlayer. The first layer L1 is formed from a silicon nitride, for example. The second layer L2 is provided on the first layer L1. The second layer L2 is formed from copper, for example. In the first region R1, the second layer L2 is patterned. A pattern formed in the second layer L2 may form the overlay mark. The third layer L3 is provided on the second layer L2 to cover the second layer L2. The third layer L3 is an interlayer insulating film, for example. The third layer L3 is formed from an optically transparent material. The third layer L3 is formed from a silicon oxide, for example.

Figure 5:
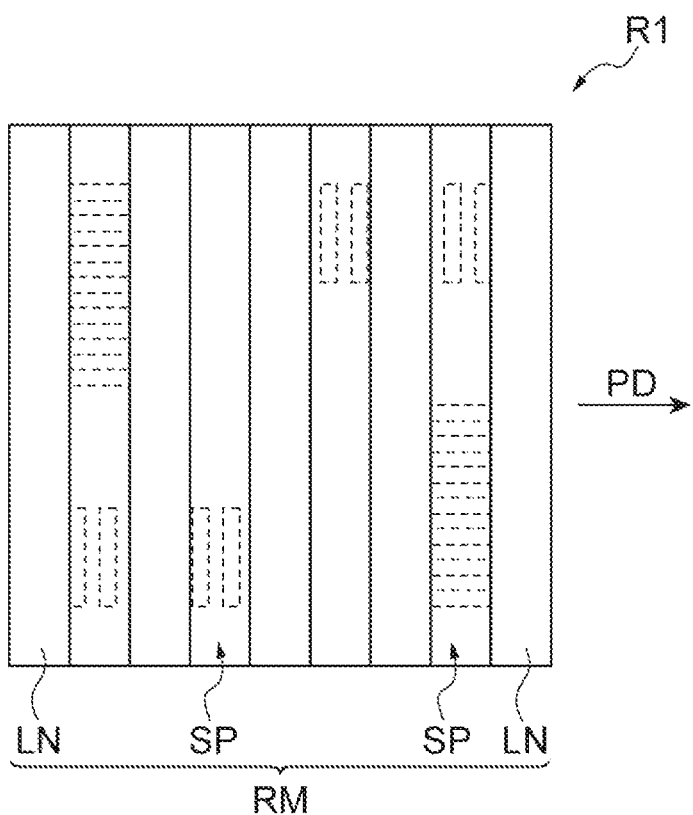
FIG. 5 is a plan view illustrating an example of the first region on which a resist mask has been formed.

As illustrated in FIG. 2, a resist mask RM is formed on the first region R1. The surface (upper surface) of the second region R2 is exposed. That is, the resist mask RM is not formed on the second region R2. The resist mask RM on the first region R1 is patterned. The resist mask RM is formed by patterning a photoresist film with a photolithography technology, for example. FIG. 5 is a plan view illustrating an example of the first region, on which a resist mask has been formed. As illustrated in FIGS. 2 and 5, a pattern of the resist mask RM may be a line-and-space pattern. That is, in an example, the pattern of the resist mask RM includes a plurality of lines LN and a plurality of spaces SP which are alternately arranged. The pattern of the resist mask RM may be any pattern other than the line-and-space pattern.

Figure 6:
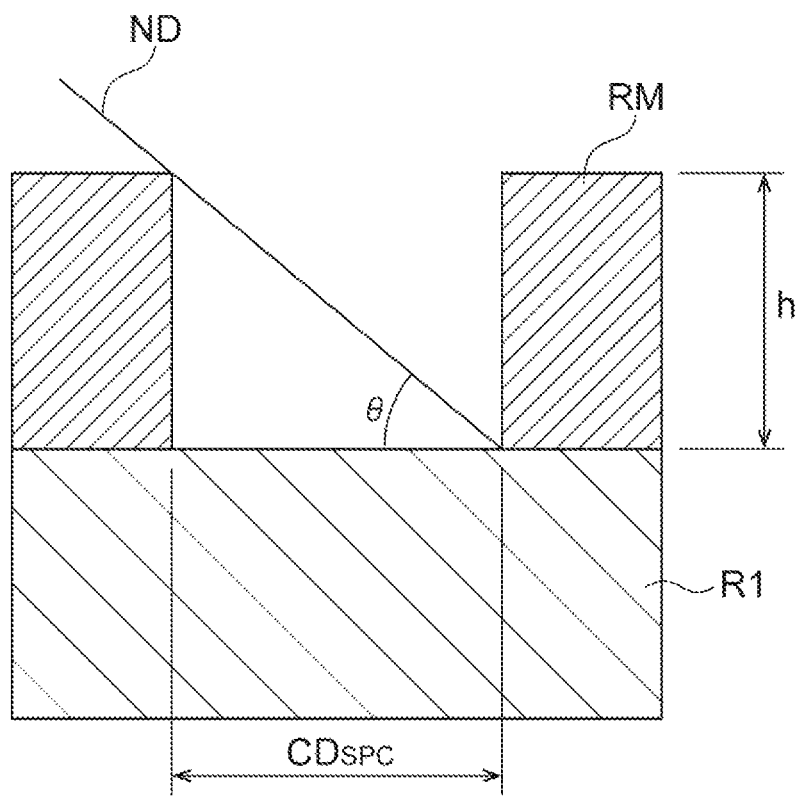
FIG. 6 is a partially-enlarged sectional view illustrating an example of the first region and the resist mask.

FIG. 6 is a partially-enlarged sectional view illustrating a example of the first region and the resist mask. As illustrated in FIG. 6, each of the plurality of lines LN has a height h. The height h represents a film thickness of each of the plurality of lines LN. Each of the plurality of spaces SP has a width $CD_{SPC}$. In an embodiment, the height h and the width $CD_{SPC}$ may satisfy the following expression (1).

$$CD_{SPC} \leq h/\tan\theta \quad (1)$$

In the expression (1), $\theta$ represents an angle formed by a normal direction ND of a target (described later) and a horizontal plane.

Figure 7:
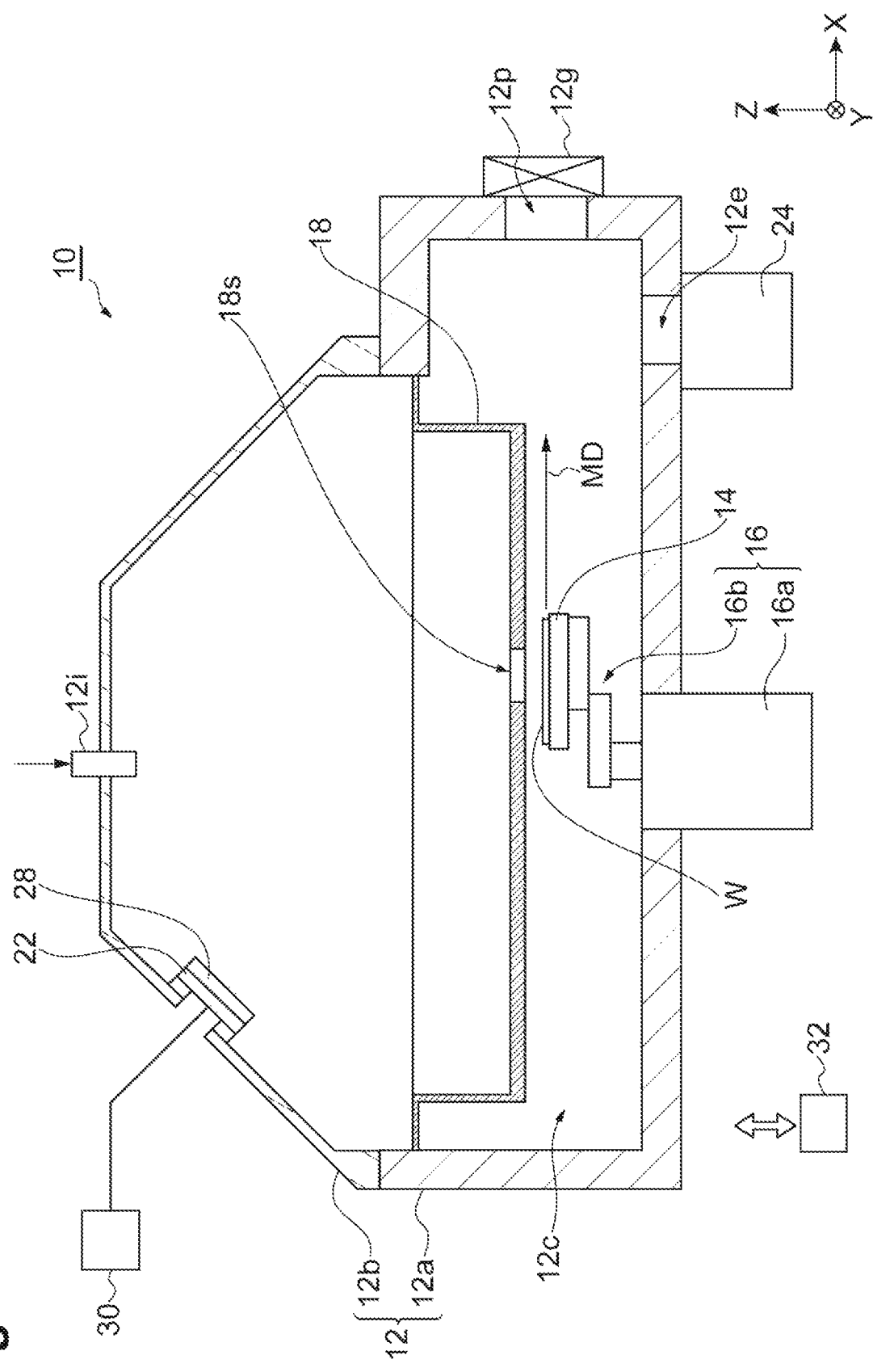
FIG. 7 schematically illustrates an example of a film formation apparatus capable of being used in the method illustrated in FIG. 1.
Figure 8:
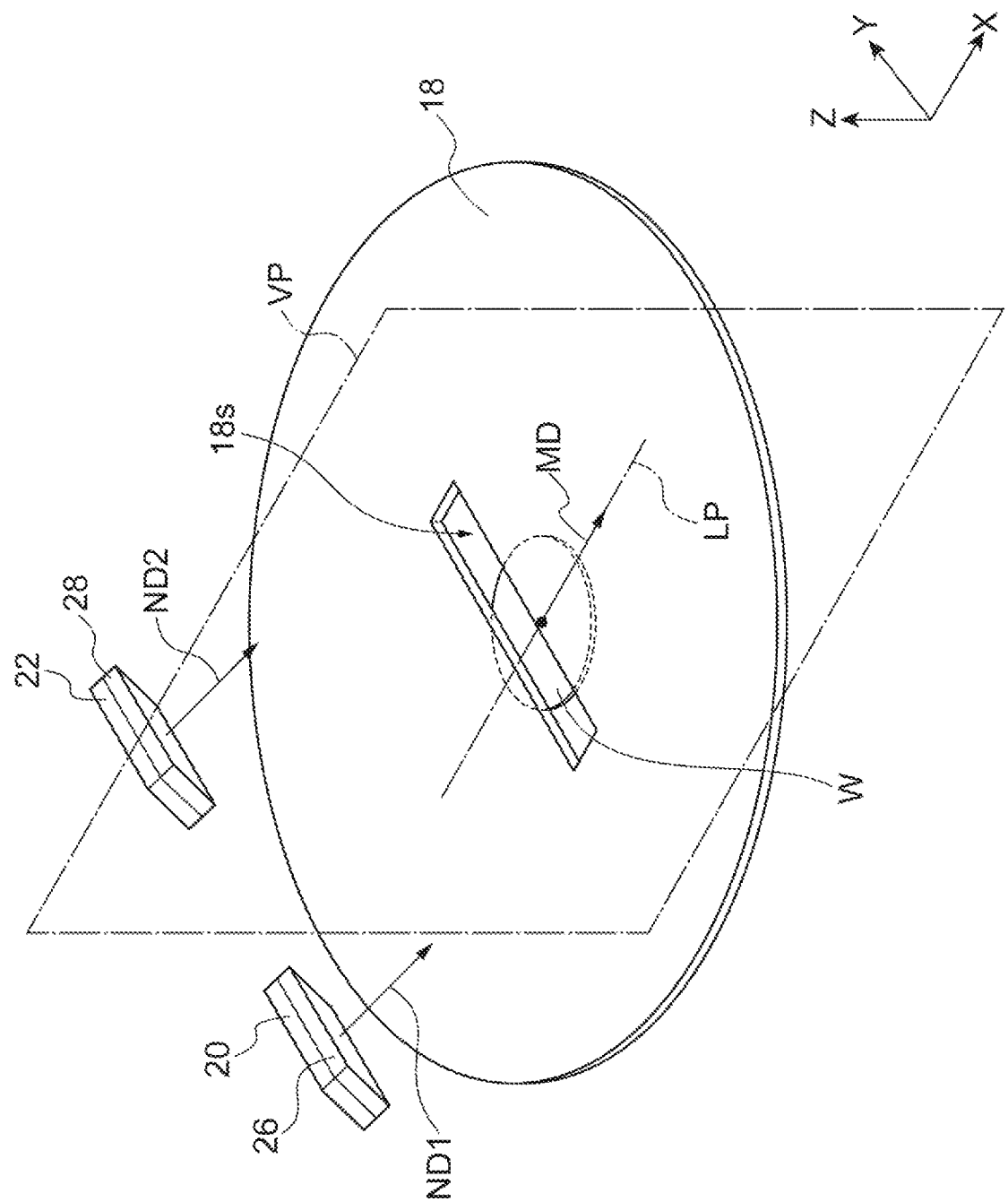
FIG. 8 is a perspective view illustrating a first holder, a second holder, and a shielding member of the example of the film formation apparatus illustrated in FIG. 7, along with a first target, a second target, and a substrate.
Figure 9:
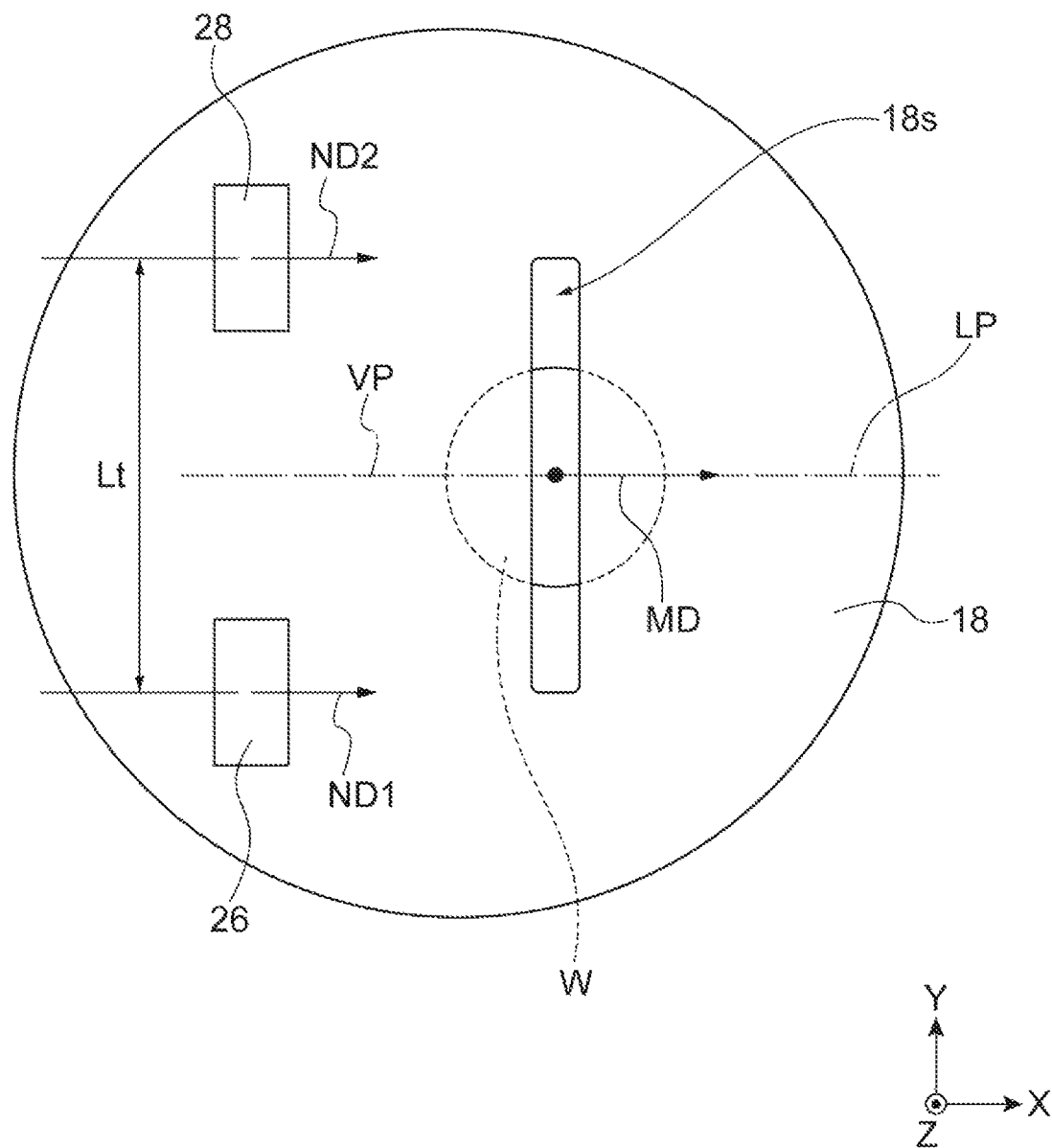
FIG. 9 is a plan view illustrating the shielding member of the example of the film formation apparatus illustrated in FIG. 7, along with the first target, the second target, and the substrate.

In the method MT, in Step ST1, as described above, a substrate is prepared in a chamber of a film formation apparatus. FIG. 7 is a schematically illustrates an example of a film formation apparatus capable of being used in the method illustrated in FIG. 1. FIG. 7 illustrates a state where a film formation apparatus 10 is partially broken. FIG. 8 is a perspective view illustrating a first holder, a second holder, and a shielding member in the example of the film formation apparatus illustrated in FIG. 7, along with a first target, a second target, and a substrate. FIG. 9 is a plan view illustrating the shielding member in the example of the film formation apparatus illustrated in FIG. 7, along with the first target, the second target, and the substrate. The film formation apparatus 10 performs film formation by sputtering. The film formation apparatus 10 includes a chamber 12, a support 14, a moving device 16, a shielding member 18, a first holder 20, and a second holder 22.

The chamber 12 provides an internal space 12c therein. The chamber 12 may include a main body 12a and a lid 12b. The main body 12a may have a substantially cylindrical shape. The upper end of the main body 12a opens. The lid 12b is provided on the upper end of the main body 12a, to close an opening at the upper end of the main body 12a.

An exhaust port 12e is formed in the bottom of the chamber 12. An exhaust device 24 is connected to the exhaust port 12e. The exhaust device 24 may include a pressure control device and a depressurization pump. The pressure control device is an automatic pressure control valve, for example. The depressurization pump may include a turbomolecular pump and/or a dry pump. An opening 12p is formed in a side wall of the chamber 12. When the substrate W is transferred between the internal space 12c and the outside of the chamber 12, the substrate W passes through the opening 12p. The opening 12p can be opened or closed by a gate valve 12g. A port 12i for introducing a gas into the internal space 12c is provided in the chamber 12. A gas from a gas supply unit, for example, an inert gas is introduced into the internal space 12c through the port 12i.

The support 14 is provided in the internal space 12c. The support 14 is configured to support the substrate W placed thereon. The substrate W is placed on the support 14 so that the surface of the substrate W is maintained substantially horizontally.

The moving device 16 moves the support 14 with maintaining the surface of the substrate W horizontally. The moving device 16 moves the support 14 such that the center of the substrate W supported by the support 14 moves on a linear path LP. The linear path LP is a path which is in a virtual horizontal plane and has a linear shape. The linear path LP is a path extending in one direction, that is, in a movement direction MID, in the horizontal plane. The movement direction MD is identical to an X-direction in FIGS. 7 to 9.

The moving device 16 may include a driving device 16a and an articulated arm 16b. The driving device 16a generates a driving force for moving one end of the articulated arm 16b in the X-direction. The driving device 16a is a motor, for example. The support 14 is attached to one end of the articulated arm 16b. The other end of the articulated arm 16b is pivotally supported by a drive shaft of the driving device 16a.

The shielding member 18 is provided in the internal space 12c. The shielding member 18 is provided above a region in which the substrate W is moved by the moving device 16. The shielding member 18 has a plate shape which extends substantially horizontally above the region in which the substrate W is moved by the moving device 16. The internal space 12c is divided into an upper space and a lower space by the shielding member 18. The lower space of the internal space 12c includes the region in which the substrate W is moved by the moving device 16.

A slit 18s is formed in the shielding member 18. The slit 18s penetrates the shielding member 18 in a vertical direction (that is, Z-direction). The slit 18s extends in a Y-direction. The Y-direction is a direction perpendicular to the X-direction in the horizontal plane and is a direction perpendicular to the movement direction MD (that is, X-direction). The slit 18s extends long in the Y-direction and has a substantially rectangular shape, for example. That is, the width of the slit 18s in the Y-direction is greater than the width of the slit 18s in the X-direction. The width of the slit 18s in the Y-direction is greater than the width of the substrate W in the Y-direction. The width of the slit 18s in the X-direction is smaller than the width of the substrate W in the X-direction. The slit 18s extends symmetrically with respect to a virtual vertical plane VP. The vertical plane VP is a virtual plane extending in the X-direction and the Z-direction and is a plane including the linear path LP.

The first holder 20 holds a first target 26. The first target 26 has a substantially rectangular planar shape, for example. The size of the surface (exposed surface) of the first target 26 is smaller than the size of the substrate W. For example, the width of the surface (exposed surface) of the first target 26 in the Y-direction is smaller than the width of the substrate W in the Y-direction. The width of the surface (exposed surface) of the first target 26 in a direction perpendicular to the Y-direction is smaller than the width of the substrate W in the X-direction.

The first holder 20 is formed from a material having conductivity. The first holder 20 is provided above the shielding member 18. The first holder 20 is attached to the chamber 12 through an insulating member. The first holder 20 is attached to the lid 12b through an insulating member.

The first holder 20 holds the first target 26 such that a first normal direction ND1 as a normal direction of the surface of the first target 26 is inclined downward, and the surface of the first target 26 faces the substrate W to be moved, through the slit 18s.

The second holder 22 holds the second target 28. The second target 28 has a substantially rectangular planar shape, for example. The size of the surface (exposed surface) of the second target 28 is smaller than the size of the substrate W. For example, the width of the surface (exposed surface) of the second target 28 in the Y-direction is smaller than the width of the substrate W in the Y-direction. The width of the surface (exposed surface) of the second target 28 in a direction perpendicular to the Y-direction is smaller than the width of the substrate W in the X-direction.

The second holder 22 is formed from a material having conductivity. The second holder 22 is provided above the shielding member 18. The second holder 22 is attached to the chamber 12 through an insulating member. The second holder 22 is attached to the lid 12b through an insulating member.

The second holder 22 holds the second target 28 such that a second normal direction ND2 as a normal direction of the surface of the second target 28 is inclined downward, and the surface of the second target 28 faces the substrate W to be moved, through the slit 18s.

The first holder 20 and the second holder 22 are provided such that the first target 26 and the second target 28 are disposed to be symmetrical to each other with respect to the vertical plane VP including the linear path LP. The first holder 20 and the second holder 22 are disposed to be symmetrical to each other with respect to the vertical plane VP.

The first holder 20 and the second holder 22 hold the first target 26 and the second target 28 such that a horizontal component of the first normal direction ND1 and a horizontal component of the second normal direction ND2 are parallel to the movement direction MD, respectively.

The first holder 20 and the second holder 22 hold the first target 26 and the second target 28 such that a distance Lt is not smaller than one time the maximum width of the substrate W in the direction (that is, Y-direction) perpendicular to the movement direction MD and is not grater than 2.66 times thereof, respectively. The distance Lt is a distance between the center of the surface of the first target 26 and the center of the surface of the second target 28.

One or more power sources 30 are electrically connected to the first holder 20 and the second holder 22. The one or more power sources 30 may be DC power sources in a case where the first target 26 and the second target 28 are made of a metal material. In a case where the first target 26 and the second target 28 are made of a dielectric material or an insulating material, the one or more power sources 30 are high-frequency power sources and are connected to the first target 26 and the second target 28 via the corresponding matching device.

If a voltage from the power source 30 is applied to the first holder 20, the voltage is also applied to the first target 26. If a voltage from the power source 30 is applied to the second holder 22, the voltage is also applied to the second target 28. The film formation apparatus 10 may include two power sources 30. Among the two power sources 30, one is electrically connected to the first holder 20, and the other is electrically connected to the second holder 22. The film formation apparatus 10 may include single power source 30. The single power source 30 is electrically connected to both the first holder 20 and the second holder 22.

The film formation apparatus 10 may further include a controller 32. The controller 32 controls components of the film formation apparatus 10. The controller 32 is a computer device, for example. The controller 32 includes a processor such as a CPU and a storage device such as a memory. The storage device of the controller 32 stores a program executed by the processor and recipe data in order to control the components of the film formation apparatus 10.

The controller 32 controls application of the voltage from the one or more power sources 30 to the first target 26 and the second target 28. The controller 32 controls the one or more power sources 30 such that particles are simultaneously emitted from the first target 26 and the second target 28. For example, the controller 32 controls the one or more power sources 30 to simultaneously apply the voltage to the first target 26 and the second target 28.

When a film is formed by the film formation apparatus 10, the substrate W is transferred into the internal space 12c and is placed on the support 14. The gas from the gas supply unit is introduced into the internal space 12c. The internal space 12c is depressurized by the exhaust device 24. The voltage from the one or more power sources 30 is applied to the first target 26 and the second target 28 during a period in which the substrate W is moved in the movement direction MID by the moving device 16. Thus, particles from the first target 26 and the second target 28 are emitted. The emitted particles are deposited on the substrate W. As a result, a film is formed on the substrate W. The substrate W may be repetitively moved in both the movement direction MD and an opposing direction thereof on the linear path LP, during a period in which film formation is performed on the substrate W.

In another example, the first holder 20 and the second holder 22 may hold the first target 26 and the second target 28 such that the first normal direction ND1 and the second normal direction ND2 intersect the vertical plane VP. In other words, the first holder 20 and the second holder 22 may hold the first target 26 and the second target 28 such that the first normal direction ND1 and the second normal direction ND2 are inclined downward and form an acute angle with the vertical plane VP.

Figure 10:
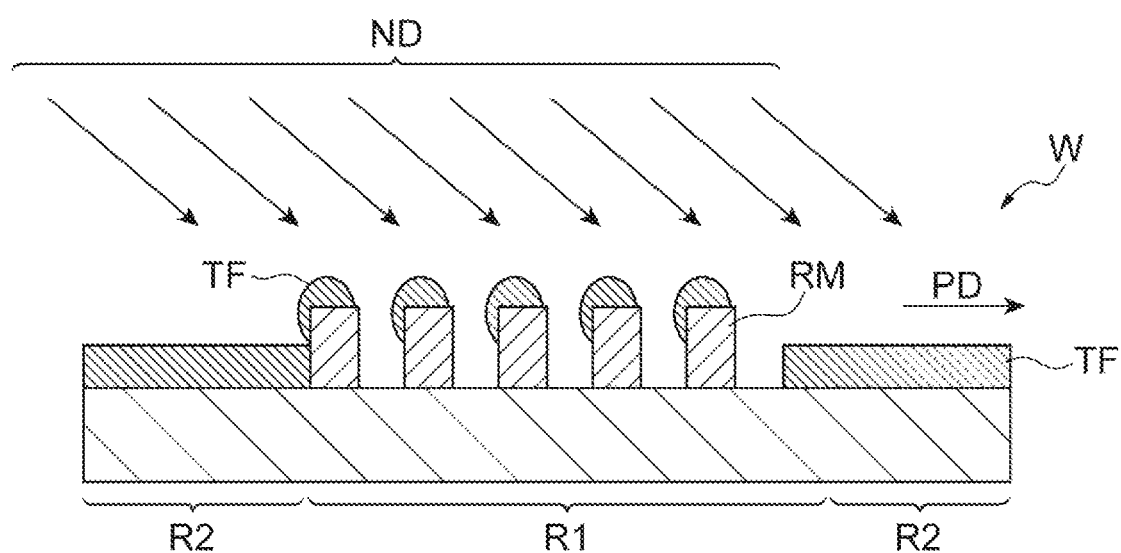
FIG. 10 is a partially-enlarged sectional view illustrating an example of a substrate, in a state after a step ST2 in the method illustrated in FIG. 1 is performed.
Figure 11:
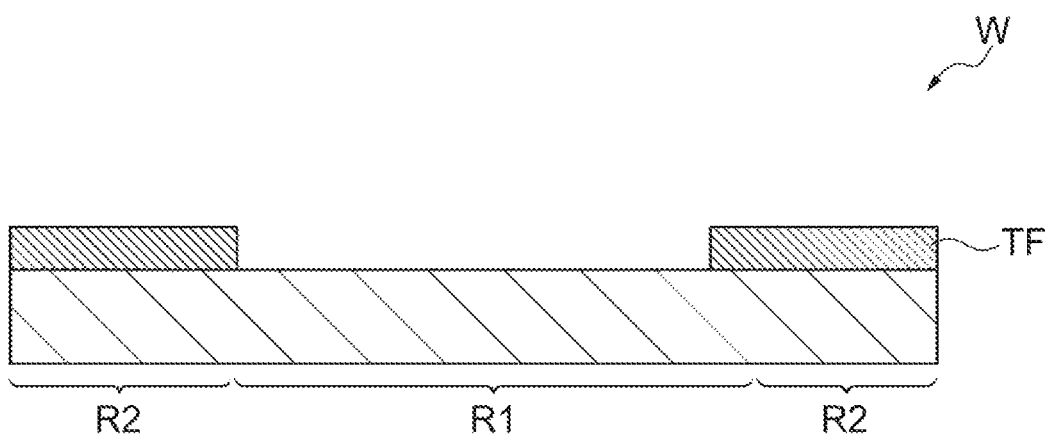
FIG. 11 is a partially-enlarged sectional view illustrating an example of a substrate, in a state after a step ST3 in the method illustrated in FIG. 1 is performed.

Descriptions will be made by referring to FIG. 1 again. The method MT will be described below in detail, taking a case where the substrate W illustrated in FIG. 2 is processed, as an example. The following descriptions will be made with reference to FIG. 1 and FIGS. 10 and 11. FIG. 10 is a partially-enlarged sectional view illustrating an example of a substrate, in a state after Step ST2 in the method illustrated in FIG. 1 is performed. FIG. 11 is a partially-enlarged sectional view illustrating an example of a substrate, in a state after Step ST3 in the method illustrated in FIG. 1 is performed.

In Step ST2, a film TF is formed on the substrate W in the chamber of the film formation apparatus by sputtering. In Step ST2, as illustrated in FIG. 10, the film TF is formed by causing particles which are emitted obliquely downward from a target to be incident onto the substrate W while a relation between a predetermined direction PD and the not al direction ND of the surface of the target in the film formation apparatus. The predetermined direction PD is a direction defined with respect to the pattern of the resist mask RM. In the example illustrated in FIGS. 2, 5, and 10, the predetermined direction PD is the direction in which the plurality of lines LN and the plurality of spaces SP are alternately arranged in the pattern of the resist mask RM. The predetermined direction PD is not limited so long as the direction PD is uniquely defined with respect to the pattern of the resist mask RM. The normal direction ND is a normal direction of the surface of the target in the film formation apparatus used in Step ST2. The normal direction ND is inclined downward, as illustrated in FIG. 10.

In a case where the film formation apparatus 10 is used in Step ST2, the substrate W is placed on the support 14. In Step ST2, the gas from the gas supply unit is introduced into the internal space 12c. In Step ST2, the internal space 12c is depressurized by the exhaust device 24. In Step ST2, the substrate W is moved in the movement direction MD by the moving device 16. In Step ST2, the substrate W is moved such that the predetermined direction PD substantially coincides with the movement direction MD. In Step ST2, during a period in which film formation is performed on the substrate W, the substrate W may be repetitively moved in both the movement direction MD and the opposing direction thereof on the linear path LP. In Step ST2, the voltage from the one or more power sources 30 is applied to the first target 26 and the second target 28 during a period in which the substrate W is moved. As a result, particles are emitted obliquely downward from the first target 26, that is, mainly in the first normal direction ND1. In addition, particles are emitted obliquely downward from the second target 28, that is, mainly in the second normal direction ND2. In a case where the film formation apparatus 10 is used in Step ST2, the noimal direction ND in FIG. 10 coincides with the first normal direction ND1 and the second normal direction ND2.

In Step ST2, during a period in which the film TF is formed, the relation between the predetermined direction PD and the normal direction ND is maintained. That is, in Step ST2, the film TF is formed without rotating the substrate W around the center of the substrate. In Step ST2, as illustrated in FIG. 10, particles from the target in the film formation apparatus are obliquely incident onto the substrate W. Thus, the film TF is not formed at a portion hidden in the incident direction of the particles. Thus, the film TF is formed on the second region R2, and the film TF is partially formed on the resist mask RM. Therefore, a region which is not covered by the film TF in the surface of the resist mask RM is widened.

The film TF may be a metal-containing film, but is not limited thereto. The metal-containing film may be formed from, for example, titanium, tungsten, aluminum, an oxide or a nitride of titanium, an oxide or a nitride of tungsten, or an oxide or a nitride of aluminum. The target of the film formation apparatus, for example, the first target 26 and the second target 28 are formed from a material constituting the film TF.

As described above, the height h, the width $CD_{SPC}$ and the angle θ may satisfy the expression (1). In this case, it is possible to suppress the occurrence of a situation in which the film TF is formed on the surface of the first region R1 exposed in the plurality of spaces SP of the resist mask RM.

The method MT may further include Step ST3. Step ST3 is performed after Step ST2. In Step ST3, the resist mask RM is removed by a lift-off process. In the lift-off process, the resist mask RM may be removed with an organic solvent. Alternatively, the resist mask RM may be removed by plasma processing with oxygen plasma using a plasma processing apparatus or by heat treatment using a heat treatment apparatus. When the lift-off process is performed in Step ST3, the film TF deposited on the resist mask RM is removed in addition to the resist mask RM, as illustrated in FIG. 11. The film TF on the second region R2 remains. Thus, the film TF can be selectively formed on the second region R2 with respect to the first region R1.

As described above, in Step ST2, the film TF is formed such that the region which is not covered by the film TF in the surface of the resist mask RM is widened. Thus, in Step ST3, a remover solution (or chemical species) easily penetrates into the resist mask RM. As a result, efficient lift-off is realized.

While various exemplary embodiments have been described above, various omissions, substitutions and changes may be made without being limited to the exemplary embodiments described above. Elements of the different embodiments may be combined to foim another embodiment.

For example, the film formation apparatus used when the method MT is performed may have a single target or three or more targets. Any film formation apparatus may be used in performing the method MT so long as particles from a target are caused to be incident in the above-described incident direction.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of forming a film on a substrate, the method comprising:
   preparing the substrate in a chamber, the substrate having a first region and a second region, a patterned resist mask being formed on the first region, and a surface of the second region being exposed;

forming the film on the substrate in the chamber by sputtering, in a state where the patterned resist mask exists on the first region; and removing the resist mask by a lift-off process after said forming the film on the substrate is performed, wherein the film is formed on the second region and partially formed on the patterned resist mask by causing particles emitted obliquely downward from a target to be incident onto the substrate while a relation between a predetermined direction defined for a pattern of the resist mask and a normal direction of a surface of the target is maintained, without forming the film on a portion of the patterned resist mask hidden in a direction along which the particles are incident onto the substrate, wherein the pattern of the resist mask is a line-and-space pattern, the predetermined direction is a direction in which a plurality of lines and a plurality of spaces are alternately arranged in the line-and-space pattern, a relation between a height h of each of the plurality of lines, a width $CD_{SPC}$ of each of the plurality of spaces, and an angle θ formed by the normal direction and a horizontal plane is set to satisfy $CD_{SPC} \leq h/\tan \theta$ to suppress formation of the film on a surface of the first region, and said forming the film does not form the film on the entire surface of the first region which is exposed in the plurality of the spaces, immediately before said removing the resist mask.

2. The method according to claim 1, wherein the film is a metal-containing film.

3. The method according to claim 2, wherein the metal-containing film is formed from titanium, tungsten, aluminum, an oxide or a nitride of titanium, an oxide or a nitride of tungsten, or an oxide or a nitride of aluminum.

* * * * *